US 6,667,909 B2

(12) United States Patent
Fournel et al.

(10) Patent No.: US 6,667,909 B2
(45) Date of Patent: Dec. 23, 2003

(54) METHOD OF ERASING A FAMOS MEMORY CELL AND A CORRESPONDING MEMORY CELL

(75) Inventors: Richard Fournel, Lumbin (FR); Cyrille Dray, Grenoble (FR); Daniel Caspar, Saint Hilaire du Touvet (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/117,446

(22) Filed: Apr. 4, 2002

(65) Prior Publication Data
US 2002/0176289 A1 Nov. 28, 2002

(30) Foreign Application Priority Data
Apr. 5, 2001 (FR) .............................. 01 04621

(51) Int. Cl.⁷ ................................ G11C 16/04
(52) U.S. Cl. ..................... 365/185.29; 365/185.27; 365/185.33; 257/315; 257/316
(58) Field of Search ................. 365/185.27, 185.29, 365/185.33; 257/315, 316

(56) References Cited

U.S. PATENT DOCUMENTS

| 4,185,319 A | 1/1980 | Stewart | ...................... 365/185 |
| 4,884,239 A | * 11/1989 | Ono et al. | ............. 365/185.27 |
| 5,706,227 A | * 1/1998 | Chang et al. | ........... 365/185.18 |
| 6,130,840 A | 10/2000 | Bergemont et al. | ..... 365/185.18 |
| 6,144,581 A | * 11/2000 | Diorio et al. | ........... 365/185.03 |

FOREIGN PATENT DOCUMENTS

EP 0778623 6/1997 ......... H01L/29/788

OTHER PUBLICATIONS

Chiu et al., Floating Gate Field Effect Transistor Memory, IBM Technical Disclosure Bulletin, vol. 16, No. 2, Jul. 1973, pp. 619–620, New York.

Yaron et al., E2FAMOS—An Electrically Erasable Reprogammable Charge Storage Device, Transactions on Electron Devices, vol. 26, No. 11, Nov. 1979, pp. 1754–1754, New York.

* cited by examiner

Primary Examiner—Son Mai
(74) Attorney, Agent, or Firm—Lisa K. Jorgenson; Allen, Dyer, Doppelt, Milbrath & Gilchrist, P.A.

(57) ABSTRACT

A FAMOS memory cell is electrically erased. The FAMOS memory cell may be electrically erased by applying to the substrate a voltage having a value at least 4 volts higher than the lower of a voltage applied to the source and a voltage applied to the drain. The voltage applied to the substrate is also less than a predetermined limit above which the memory cell is destroyed.

36 Claims, 4 Drawing Sheets

METHOD OF ERASING A FAMOS MEMORY CELL AND A CORRESPONDING MEMORY CELL

FIELD OF THE INVENTION

The invention relates to integrated circuits, and more particularly, to a FAMOS memory cell or a memory cell based on a FAMOS transistor.

BACKGROUND OF THE INVENTION

Floating gate avalanche injection MOS (FAMOS) technology uses a memory cell that includes a PMOS transistor whose single gate is isolated, that is, not electrically connected. The single gate is therefore floating.

This memory cell can be obtained without adding additional steps to the basic technological process for fabricating a PMOS transistor. Unlike other memory cells, for example FLASH, EPROM or EEPROM memory cells, which have a floating gate and a control gate, the FAMOS memory cell has only a floating gate.

It is not possible to electrically erase a FAMOS memory cell. Ultraviolet radiation must be used to erase a FAMOS memory cell. This type of memory cell is therefore more particularly used in a one time programmable (OTP) memory.

SUMMARY OF THE INVENTION

In view of the foregoing background, an object of the present invention is to avoid erasing by ultraviolet radiation so that a FAMOS memory cell can be programmed and erased several times, that is, a memory cell that includes a PMOS transistor with a single floating gate, integrated into an integrated circuit.

This and other objects, advantages and features according to the present invention are provided by electrically erasing a FAMOS memory cell. The invention therefore goes against current technology, and as a result, a FAMOS memory cell may be used as a non-volatile EEPROM or FLASH memory cell.

In one embodiment of the invention, the memory cell can be erased regardless of the voltages on the source and the drain of the PMOS transistor, provided that there is applied to the substrate a voltage having a value at least 4 volts higher than the lower of the voltages applied to the source and the drain. However, the substrate voltage must remain below a predetermined limit voltage, above which the memory cell may be destroyed.

For example, the predetermined limit voltage is the breakdown voltage of the substrate/source and substrate/drain diodes. Of course, this predetermined limit voltage, above which the memory cell may be destroyed, is based upon the technology used. At present this predetermined limit voltage is set at about 10 volts.

To reduce the time needed to erase the memory cell, a voltage can advantageously be applied to the substrate whose value is at least 6 volts higher than the lower of the voltages applied to the source and the drain. For example, to obtain an erasure time on the order of 1 minute, substrate voltages on the order of 7 to 8 volts are applied, for example. The same voltage can be applied to the source and the drain.

However, another way to reduce the erasure time is to apply a non-zero positive voltage difference between the source and the drain. With this being so, in some applications, it is preferable for the value of the difference between the source voltage and the drain voltage to remain below a predetermined threshold, so as not to place the memory cell in an intermediate electrical state. For example, a predetermined threshold value less than 2 volts, for example, on the order of 1 volt, can advantageously be used.

Instead of this, it would be equally possible to apply a variable voltage difference between the source and the drain. For example, at the start of the erase phase a positive voltage difference could be applied between the source and the drain to begin erasing faster, after which a zero voltage difference would be applied between the source and the drain to avoid an intermediate electrical state of the memory cell.

The memory cell according to the invention can be erased electrically regardless of the configuration of the PMOS transistor of the memory cell. Thus, the PMOS transistor can have a conventional linear configuration, or an annular configuration including an electrode at the center surrounded by the gate and a peripheral electrode. For some types of process, the annular configuration makes erasure more efficient by reducing the necessary erase time compared to a linear configuration.

The invention also provides a memory device including a FAMOS memory cell. According to one general feature of the invention, the memory cell is electrically erasable. In one embodiment of the invention, the memory cell includes a PMOS transistor in a semiconductor substrate, and the device includes erasing means adapted to apply to the substrate a voltage having a value at least 4 volts higher than the lower of the voltages applied to the source and to the drain, and less than a predetermined limit value above which the cell may be destroyed.

In a preferred embodiment of the invention, the erasing means apply a voltage to the substrate whose value is at least 6 volts higher than the lower of the voltages applied to the source and to the drain. To reduce the erase time, the erasing means are advantageously apply a non-zero positive voltage difference between the source and the drain, preferably less than a predetermined threshold value, for example, on the order of 1 volt.

The memory device according to the invention also includes programming means for writing data in the memory cell, reading means for reading the content of the memory cell, and control means for connecting the programming, reading and erasing means selectively to the memory cell as a function of the mode of operation used.

The device may further include a plurality of electrically erasable FAMOS memory cells, for example, a memory array formed by a matrix of memory cells organized in rows and columns. The invention also provides an integrated circuit including a memory device as defined above.

BRIEF DESCRIPTION OF THE DRAWINGS

Other advantages and features of the invention will become apparent on examining the detailed description of non-limiting embodiments of the invention and the accompanying drawings, in which.

DETAILED DESCRIPTION OF THE PREFERRED EMBODIMENTS

Figure 1:
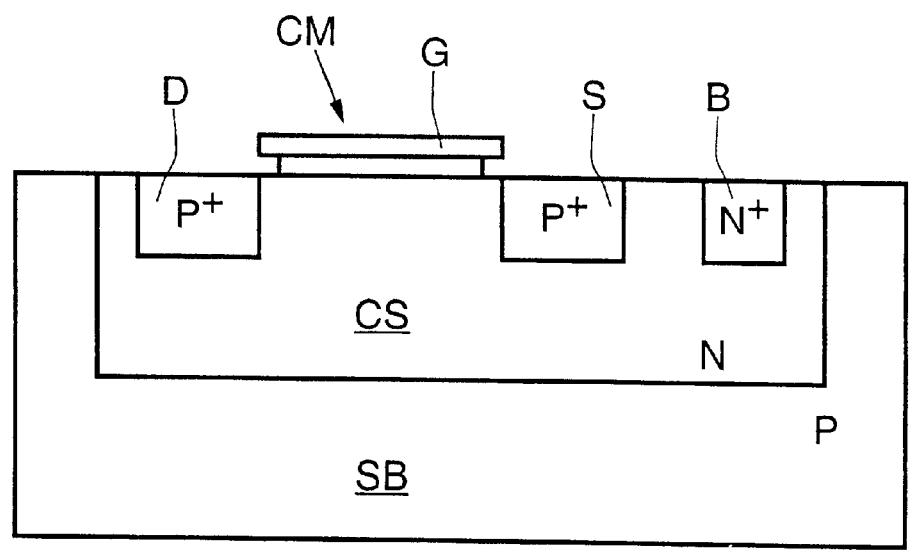
FIG. 1 diagrammatically illustrates a first embodiment of a FAMOS memory cell according to the invention.

FIG. 1 illustrates a FAMOS memory point or memory cell CM according to the invention. The memory cell includes a PMOS transistor having a gate G, a P+-doped drain region D and a P+-doped source region S. In the illustrated example, the MOS transistor is formed in an N-type well CS in a P-type substrate SB. The transistor of the memory cell CM further includes an N+-doped substrate bulk B, which in this example is a well bulk.

One difference between the FAMOS memory cell and a conventional P-type MOS transistor is that the single gate of the MOS transistor is not electrically connected in the cell CM. In other words, the gate G is floating. Also, the gate oxide thickness and the implantation can be adjusted to optimize the performance of the cell.

Figure 3:
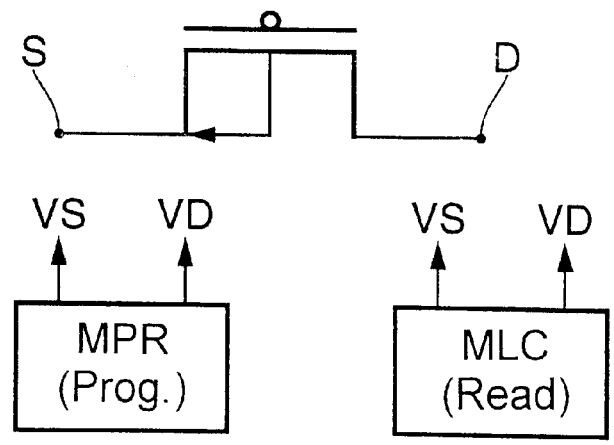
FIG. 3 diagrammatically illustrates one approach for programming and reading a memory cell according to the present invention.

The memory cell is programmed and read in a conventional way known to the person skilled in the art. The general principles of programming and reading the memory cell are described briefly here with particular reference to FIG. 3. FIG. 3 shows that for programming and reading a memory cell, it is conventional to connect the source and the well bulk to eliminate the substrate effect.

The memory point is programmed by hot electrons. To be more precise, programming means MPR includes a voltage source for applying a programming voltage VS to the source S and a voltage VD to the drain, for example, ground. The programming voltage applied to the source is equal to 5 volts, for example. The potential of the gate rises by capacitive coupling with the source and the well bulk. Hot electrons are then created at the level of the drain and injected into the gate.

When the memory cell is programmed, the FAMOS transistor is depleted and the source-drain current is on the order of 50 to 250 μA. When a FAMOS cell is blank, that is, not programmed, the source/drain current is on the order of a few nA. To read the cell, read means MLC apply the supply voltage VS to the source (for example, 3.3 volts) and a voltage VD (for example, 2.3 volts) to the drain, such that VS-VD is less than or equal to 1 volt.

Figure 2:
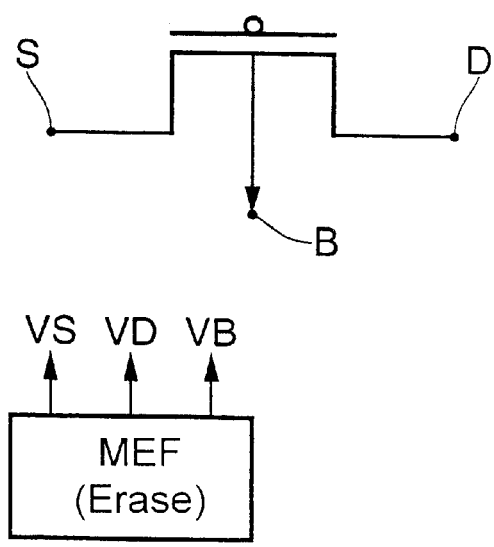
FIG. 2 diagrammatically illustrates one approach for erasing a memory cell according to the present invention.

According to the invention, a FAMOS memory cell is erased electrically. To be more precise, as shown in FIG. 2 in particular, erasing means MEF are provided. The erasing means includes one or more voltage sources, and respectively applies a chosen voltage to the source, the drain and the well bulk. In this regard, in erasure mode, the well bulk is no longer connected to the source of the memory cell. A switch is provided, for example, for selectively connecting the source and the well bulk together as a function of the operating mode (programming mode or erasure mode).

The erasing means MEF apply a voltage VS to the source and a voltage VD to the drain. The cell is erased electrically, regardless of the values of VS and VD, provided that the erasing means MEF apply a voltage VB to the substrate (well bulk B) having a voltage at least 4 volts higher than the lower of the voltages applied to the source and the drain.

Thus, if the voltages VS and VD are zero, for example, the voltage VB will be chosen so that it is at least equal to 4 volts. This being so, it would be equally feasible to apply negative voltages to the source and/or the drain. However, in this case, the voltage VB would still be chosen so that it was always greater than the lower of the voltages applied to the source and the drain.

The voltage VB to be applied to the well bulk B must nevertheless remain below a limit, above which the memory cell may be destroyed. To be more precise, destruction is synonymous here with breakdown of the well-source and/or well-drain diode. In the technologies currently used, this breakdown voltage is on the order of 10 volts and consequently the voltage VB will hardly exceed 9 volts.

The value of the voltage VB also affects the time needed to erase the memory cell. The higher the voltage, the shorter the erasure time. For example, with the technologies used, erasure times on the order of 1 minute are obtained for voltages VB on the order of 7 to 8 volts.

Another parameter that affects the erase time is the value of the difference between the voltage VS and the voltage VD. The greater the difference, the shorter the erase time. With this being so, applying a source/drain voltage difference greater than a predetermined threshold value can place the cell in an intermediate electrical state, regardless of its initial state prior to erasure. This leads, for example, to a source/drain current on the order of a few μA, as against a few nA for a blank cell.

This is why it is preferable in some applications to limit the value of the voltage difference VS-VD to around 1 volt, for example. For example, for 0.18 μm technology, applying a source voltage VS on the order of 1 volt, a zero drain voltage and a substrate voltage VB on the order of 7 to 8 volts electrically erases the memory cell in approximately 1 minute.

Figure 4:
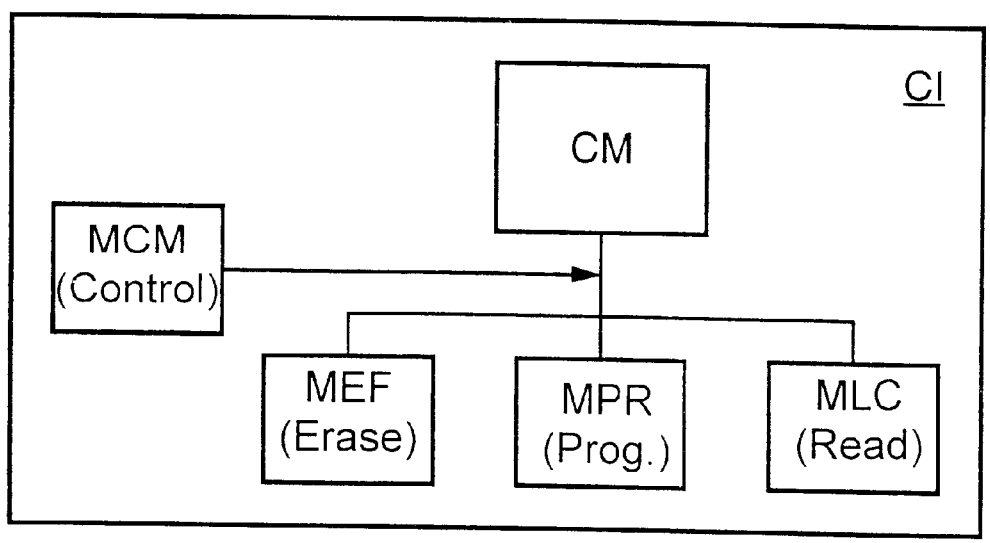
FIG. 4 is a block diagram of an integrated circuit including a memory cell and various circuits for erasing, programming and reading thereof according to the present invention.

Of course, if the memory cell CM is integrated into an integrated circuit CI (FIG. 4), the control device surrounding the memory cell includes the erasing means MEF, the programming means MPR, the reading means MLC and also the control means MCM. The control means MCM includes, for example, switching logic capable of selectively connecting each of these means to the memory cell as a function of the operating mode.

A FAMOS memory cell can be erased electrically regardless of the configuration of the PMOS transistor that forms it. Thus, a linear configuration can be used, corresponding to the FIG. 1 embodiment, and as shown diagrammatically in FIG. 5.

Figure 5:
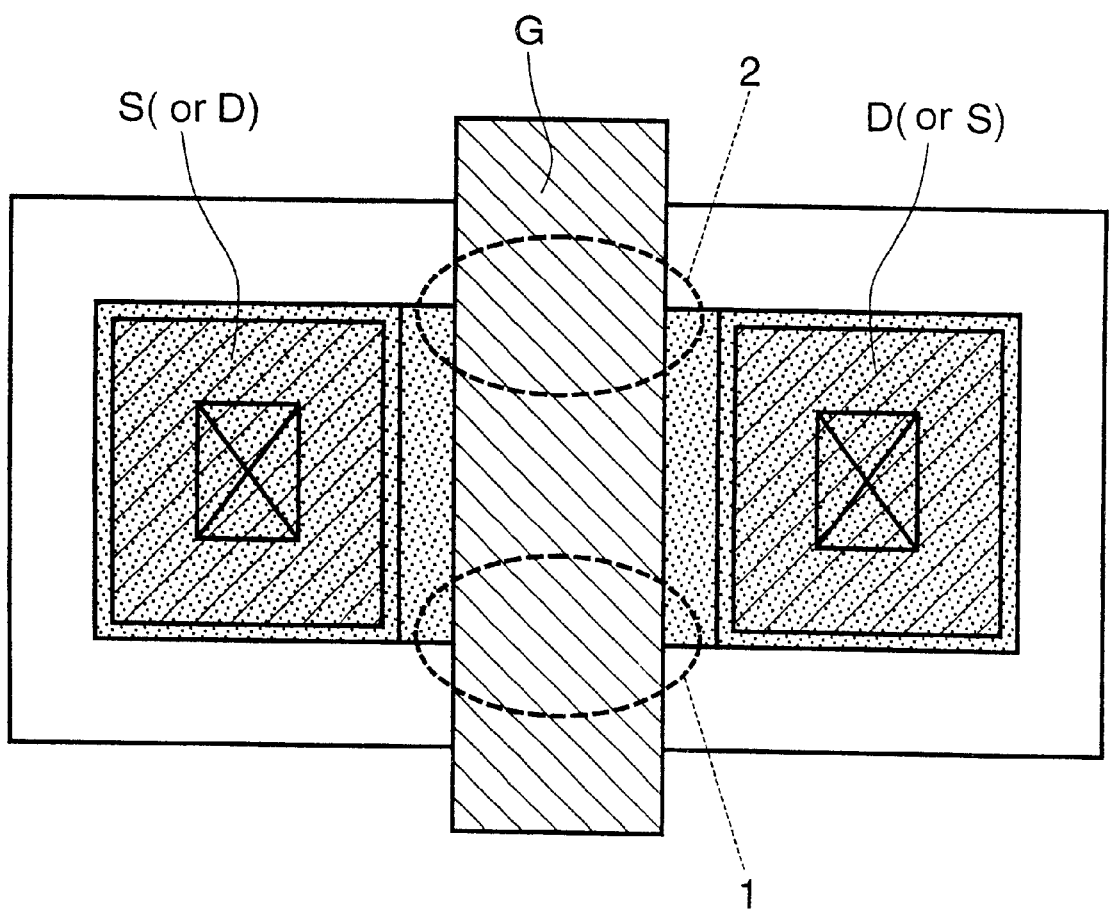
FIGS. 5 and 6 illustrate two configurations of the PMOS transistor of a memory cell according to the present invention.

In FIG. 5, the drain diffusion area D and source diffusion area S are formed in N-type wells, and are transversely aligned relative to the polysilicon gate G. The various active components are conventionally isolated from the substrate by field oxide. The memory cell is therefore isolated from the other active components of the integrated circuit by the field oxide, which completely surrounds the transistor, which is delimited by the well. Various techniques can be used to produce the field oxide, such as the localized oxidation (LOCOS) technique or a shallow trench isolation (STI) technique, with which the surface oxide may be thinner.

Figure 6:
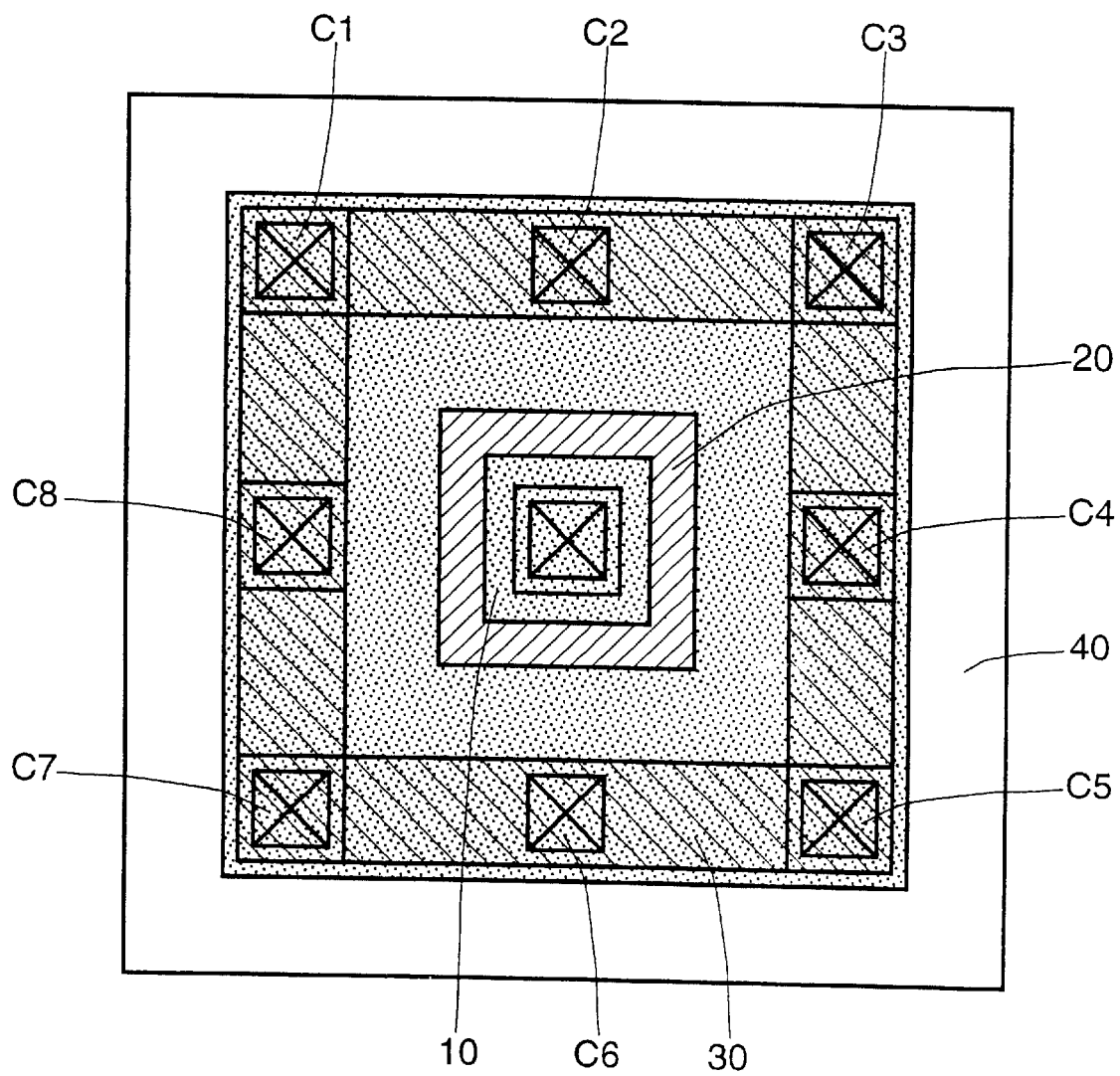

With this being so, it is particularly advantageous to use an annular configuration of the PMOS transistor, like that shown diagrammatically in FIG. 6. In this configuration a central diffusion area 10 and a peripheral diffusion area 30 are formed. The polysilicon gate 20 is in the volume delimited by the two diffusion areas. The field oxide 40 surrounds the peripheral diffusion area.

This kind of annular implementation does not necessitate any additional fabrication step. The difference between the straight (linear) configuration and the annular configuration resides simply in the design of the various components. In the annular configuration, it is further preferable to provide a plurality of contact points C1–C8 over the peripheral diffusion area 30 to reduce the peripheral diffusion area access resistance.

The annular configuration obtains improved performance of the memory cell according to the invention, both with regard to the retention of data and with regard to the erase time. The interfaces 1 and 2 between the field oxide and the gate G in a linear configuration (FIG. 5) are fragile areas of the structure due to the height differences between the components. This influences the data retention time and the erase time.

With the annular configuration, the floating (unconnected) gate 20 is confined in a volume inside the peripheral diffusion area. Accordingly, with the gate being combined within the structure of the FAMOS memory cell itself, there is no longer any interface between the gate and the field oxide. Furthermore, by making the peripheral electrode 30 the source S and the central electrode 10 the drain D, capacitive gate-source coupling is enhanced, to the detriment of gate-drain capacitive coupling. This achieves a higher gate potential in the programming phase. Thus, programming is faster and the quantity of charge injected into the gate is greater. Also, in the erasure phase, the annular configuration reduces the time necessary for erasing.

The invention is not limited to the embodiments just described but encompasses all variations thereof. Thus, everything that has just been described applies equally well if the memory cell CM is formed directly in an N-type substrate SB or in an SOI (silicon on insulator) process. Furthermore, the invention applies equally well to an annular configuration in which the central electrode is the source and the peripheral electrode is the drain. Moreover, the integrated circuit according to the invention can incorporate one or more FAMOS memory cell matrices in accordance with the invention, electrically erasable individually, to form one or more memory planes addressable conventionally by rows and by columns, and forming electrically erasable and programmable non-volatile memories (FLASH, EEPROM).

That which is claimed is:

1. A method of erasing at least zone FAMOS memory cell comprising at least one MOS transistor comprising spaced apart source and drain regions in a semiconductor substrate and defining a channel therebetween, a single floating gate overlying the channel and being devoid of a control gate, the method comprising:

electrically erasing the at least one FAMOS memory cell.

2. A method according to claim 1, wherein the at least one MOS transistor comprises a PMOS transistor, the method further comprising:

applying to the source region a first voltage;
   applying to the drain region a second voltage; and
   applying to the semiconductor substrate a third voltage having a value at least 4 volts higher than a lower of the first and second voltages, and less than a predetermined limit above which destroys the at least one FAMOS memory cell.

3. A method according to claim 2, wherein the third voltage is at least 6 volts higher than the lower of the first and second voltages.

4. A method according to claim 2, wherein the predetermined limit is about 10 volts.

5. A method according to claim 2, wherein applying the first and second voltages results in 2, a non-zero positive voltage difference between the source and drain regions.

6. A method according to claim 5, wherein applying the first and second voltages results in a voltage difference between the source and drain regions that is less than a predetermined threshold.

7. A method according to claim 6, wherein the predetermined threshold is about 1 volt.

8. A method according to claim 2, wherein applying the first and second voltages results in a variable voltage difference being applied between the source and drain regions during erasure of the at least one FAMOS memory cell.

9. A method according to claim 1, wherein the drain region is at a center of the at least one FAMOS memory cell, the source region is at a peripheral of the at least one FAMOS memory cell, and the floating gate is between the source and drain regions and surrounds the drain region so that the at least one FAMOS memory cell has an annular configuration.

10. A memory device comprising:

a semiconductor substrate; and
    at least one FAMOS memory cell in said semiconductor substrate that is electrically erasable and comprising at least one MOS transistor, said at least one MOS transistor comprising spaced apart source and drain regions in said semiconductor substrate and defining a channel therebetween, and a single floating gate overlying the channel and devoid of a control gate.

11. A memory device according to claim 10, wherein said at least one MOS transistor comprises a PMOS transistor; and further comprising:

an erase circuit for applying to said source region a first voltage, for applying to said drain region a second voltage, and for applying to said semiconductor substrate a third voltage having a value at least 4 volts higher than a lower of the first and second voltages, and less than a predetermined limit above which destroys said at least one FAMOS memory cell.

12. A memory device according to claim 11, wherein the third voltage is at least 6 volts higher than the lower of the first and second voltages.

13. A memory device according to claim 11, wherein the predetermined limit is about 10 volts.

14. A memory device according to claim 11, wherein applying said first and second voltages results in a non-zero positive voltage difference between the source and drain regions.

15. A memory device according to claim 14, wherein applying the first and second voltages results in a voltage difference between said source and drain region that is less than a predetermined threshold.

16. A memory device according to claim 15, wherein the predetermined threshold is about 1 volt.

17. A memory device according to claim 11, wherein applying the first and second voltages results in a variable voltage difference being applied between said source and drain regions during erasure of said at least one FAMOS memory cell.

18. A memory device according to claim 11, wherein said drain region is at a center of said at least one FAMOS memory cell, said source region is at a peripheral of said at least one FAMOS memory cell, and said floating gate is between said source and drain regions and surrounds said drain region so that said at least one FAMOS memory cell has an annular configuration.

19. A memory device according to claim 11, further comprising:

a program circuit for writing data in said at least one FAMOS memory cell;
    a read circuit for reading said at least one FAMOS memory cell; and a control circuit connected to said erase circuit, to said program circuit and to said read circuit for selectively connecting one of said erase, program and read circuits to said at least one FAMOS memory cell.

20. A memory device according to claim 10, wherein said at least one electrically erasable FAMOS memory cell comprises a plurality of electrically erasable FAMOS memory cells.

21. An integrated circuit comprising:

a semiconductor substrate;

at least one FAMOS memory cell in said semiconductor substrate that is electrically erasable, said at least one FAMOS memory cell comprising a PHOS transistor comprising spaced apart source and drain regions in said semiconductor substrate and defining a channel therebetween, and a floating gate overlying the channel;

a program circuit in said semiconductor substrate for writing data in said at least one FAMOS memory cell; and an erase circuit in said semiconductor substrate for erasing data in said at least one FAMOS memory cell by applying to said source region a first voltage, for applying to said drain region a second voltage, and for applying to said semiconductor substrate a third voltage having a value at least 4 volts higher than a lower of the first and second voltages, and less than a predetermined limit above which destroys said at least one FAMOS memory cell;

the first and second voltages being applied to said source and drain regions results in a non-zero positive voltage difference therebetween that is less than about 1 volt.

22. An integrated circuit according to claim 21, further comprising a read circuit in said semiconductor substrate for reading said at least one FAMOS memory cell.

23. An integrated circuit according to claim 21, further comprising a control circuit in said semiconductor substrate and connected to said program circuit and to said erase circuit for selectively connecting one of said erase and program circuits to said least one FAMOS memory cell.

24. An integrated circuit according to claim 21, wherein the third voltage is at least 6 volts higher than the lower of the first and second voltages.

25. An integrated circuit according to claim 21, wherein the predetermined limit is about 10 volts.

26. An integrated circuit according to claim 21, wherein applying the first and second voltages results in a variable voltage difference being applied between said source and drain regions during erasure of said at least one FAMOS memory cell.

27. An integrated circuit according to claim 21, wherein said drain region is at a center of said at least one FAMOS memory cell, said source region is at a peripheral of said at least one FAMOS memory cell, and said floating gate is between said source and drain regions and surrounds said drain region so that said at least one FAMOS memory cell has an annular configuration.

28. An integrated circuit comprising:

a semiconductor substrate;

at least one FAMOS memory cell in said semiconductor substrate that is electrically erasable, said at least one FAMOS memory cell comprising a PMOS transistor comprising spaced apart source and drain regions in said semiconductor substrate and defining a channel therebetween, and a floating gate overlying the channel;

said drain region at a center of said at least one FAMOS memory cell, said source region at a peripheral of said at least one FAMOS memory cell, and said floating gate between said source and drain regions and surrounding said drain region so that said at least one FAMOS memory cell has an annular configuration;

a program circuit in said semiconductor substrate for writing data in said at least one FAMOS memory cell; and an erase circuit in said semiconductor substrate for erasing data in said at least one FAMOS memory cell by applying to said source region a first voltage, for applying to said drain region a second voltage, and for applying to said semiconductor substrate a third voltage having a value at least 4 volts higher than a lower of the first and second voltages, and less than a predetermined limit above which destroys said at least one FAMOS memory cell.

29. An integrated circuit according to claim 28, further comprising a read circuit in said semiconductor substrate for reading said at least one FAMOS memory cell.

30. An integrated circuit according to claim 28, further comprising a control circuit in said semiconductor substrate and connected to said program circuit and to said erase circuit for selectively connecting one of said erase and program circuits to said least one FAMOS memory cell.

31. An integrated circuit according to claim 28, wherein the third voltage is at least 6 volts higher than the lower of the first and second voltages.

32. An integrated circuit according to claim 28, wherein the predetermined limit is about 10 volts.

33. An integrated circuit according to claim 28, wherein applying the first and second voltages results in a non-zero positive difference between the source and drain regions.

34. A integrated circuit according to claim 33, wherein applying the first and second voltage results in a voltage difference between said source and drain regions that is less than a predetermined threshold.

35. An integrated circuit according to claim 34, wherein the predetermined threshold is about 1 volt.

36. An integrated circuit according to claim 28, wherein applying the first and second voltages results in a variable voltage difference being applied between said source and drain regions during erasure of said at least one FAMOS memory cell.

* * * * *

UNITED STATES PATENT AND TRADEMARK OFFICE
CERTIFICATE OF CORRECTION

PATENT NO.      : 6,667,909 B2
DATED           : December 23, 2003
INVENTOR(S)     : Fournel et al.

It is certified that error appears in the above-identified patent and that said Letters Patent is hereby corrected as shown below:

Column 5,
Line 39, delete "zone" insert -- one --

Column 7,
Line 13, delete "PHOS" insert -- PMOS --

Signed and Sealed this

Twenty-second Day of June, 2004

JON W. DUDAS
*Acting Director of the United States Patent and Trademark Office*